United States Patent [19]

Nakajima

[11] Patent Number: 5,313,057

[45] Date of Patent: May 17, 1994

[54] NON-SELECTIVE PHOTORECEIVER FOR FREQUENCY-MODULATED OPTICAL SIGNALS AND OPTICAL LINK USING SAID RECEIVER

[75] Inventor: Hisao Nakajima, Bagneux, France

[73] Assignee: France Telecom Etablissement Autonome de Droit Public, Paris, France

[21] Appl. No.: 982,978

[22] Filed: Nov. 30, 1992

[30] Foreign Application Priority Data

Dec. 20, 1991 [FR] France ............... 91 15890

[51] Int. Cl.$^5$ ........................... H01J 40/14
[52] U.S. Cl. .................... 250/214 R; 372/18; 359/152
[58] Field of Search ............ 250/214 R, 214 A; 372/28, 18, 38, 26, 44, 96, 31, 23; 359/189, 112, 167, 185, 152, 113, 132

[56] References Cited

U.S. PATENT DOCUMENTS 5,220,572 6/1993 Kawaguchi ............... 372/18
5,222,089 6/1993 Huber ..................... 372/26

FOREIGN PATENT DOCUMENTS 0356302 2/1990 European Pat. Off. .
0420742 4/1991 European Pat. Off. .
2662883 12/1991 France .
2144598 3/1985 United Kingdom .

OTHER PUBLICATIONS

Laser Focus World, vol. 25, No. 8, pp. 129-133, Aug., 1989, T. P. Lee, "Diode-Laser Developers Look to Broadband Optical Communications".
Electronics Letters, vol. 25, No. 14, pp. 890-892, Jul. 6, 1989, T. L. Koch, et al., "Tunable Multiple-Quantum-Well Distributed-Bragg-Reflector Lasers as Tunable Narrowband Receivers".

Primary Examiner—David C. Nelms
Assistant Examiner—Que T. Le
Attorney, Agent, or Firm—Oblon, Spivak, McClelland, Maier & Neustadt

[57] ABSTRACT

A non-selective photoreceiver for frequency-modulated optical signals and optically using the receiver. The photoreceiver includes a laser operating under longitudinal multimode conditions, such as a FABRY-PEROT-type laser operating in a longitudinal multimode. The photoreceiver can function around any one of the longitudinal modes of the laser in overlapping frequency ranges, providing a wide overall band of operation. The plurality of modes reduces the selectively of the photoreceiver. The invention is also related to an optical link, which is either unidirectional using a photoreceiver as described above, or using two subassemblies each having a photoreceiver according to the invention, each photoreceiver being able to operate in an emission or a reception mode.

6 Claims, 6 Drawing Sheets

NON-SELECTIVE PHOTORECEIVER FOR FREQUENCY-MODULATED OPTICAL SIGNALS AND OPTICAL LINK USING SAID RECEIVER

DESCRIPTION

1. Technical Field

The present invention relates to a non-selective receiver for frequency-modulated optical signals and to an optical link using such a photoreceiver. It is used in optical telecommunications.

2. Prior Art

FR-A-2 652 465 describes a photoreceiver comprising a semiconductor laser supplied well above the threshold. A frequency-modulated optical signal is injected into said laser. The voltage sampled at the terminals of the latter reflects the frequency swing between the frequency of the optical signal and that of the laser.

This procedure is also described in the article by Hisao NAKAJIMA entitled "Demodulation of Multi-Gigahertz Frequency Modulated Optical Signals in an Injection-Locked Distributed Feedback Laser Oscillator", published in Electronics Letters, July 19, 1990, vol. 26, No. 15. The attached FIG. 1 illustrates the structure and operation of said photoreceiver.

FIG. 1 shows a laser 10, e.g. of the distributed feedback (DFB) type. Such a laser is conventionally constituted by a stack of semiconductor layers, with in particular an active layer surrounded by two confinement layers and a distributed network. The semiconductor can belong to the family of binary, ternary or quaternary III-V compounds, such as e.g. InGaAsP on InP. The laser is supplied by a power supply 12 and is equipped with a means 14 able to measure the voltage at its terminals.

The injected current I is more than twice the threshold current Is of the laser. Thus, the laser is placed under oscillator operating conditions. It emits a light radiation 16, 18 having a clearly defined frequency Fo or, if desired, a clearly defined wavelength λo.

A light beam 20 of frequency F (or wavelength λ) is injected into the laser 10. Its frequency is supposed to be modulated. For explanatory purposes the left-hand side of the drawing has a graph showing that the frequency can assume two values F1 and F2 (F1 can correspond to a logic 0 and F2 to a logic 1 in a binary information system).

The voltage V taken at the terminals of the laser by the means 14 can then assume two values V1 and V2 represented in the right-hand part and corresponding to the two frequencies F1 and F2.

In this example, the frequencies F1 and F2 surround the frequency Fo of the laser, F2 exceeding Fo. In this hypothesis, the operating frequency of the receiver laser will drift towards F1 or F2 under the effect of the injection of the beam 20, which will shift the operating voltage to the bottom or top.

FIG. 2 shows an example of an optical connection using this photoreceiver type. There is a first laser 10 supplied by a power supply 12 and a second laser 30 serving as an emitter. The second laser is supplied by a power supply 32 across a polarization T-coupler 34 comprising an inductance coil and a capacitor, the latter being connected to a high frequency oscillator 36. The current injected into the laser 30 is weakly intensity modulated in order to avoid light intensity modulation.

As a result the emitted light beam 20 is frequency-modulated about a mean frequency.

Optical means are also provided for injecting the modulated beam into the laser 10 serving as the photoreceiver. These means comprise a first lens L1, and attenuator A, an optical isolator P, a half-wave plate LD and a second lens L2 which can be a microscope objective.

The means for measuring the voltage at the laser terminals comprise, following a polarization T-coupler 40 constituted by an inductance coil and a capacitor, an amplifier 42 and a spectrum analyzer 44. This analyzer gives the intensity of the voltage component at the modulation frequency of the generator 36. There are also means for stabilizing the temperature of the lasers, diagrammatically represented by the broken line rectangles 50 and 52.

In this prior art procedure, the receiver laser 10 operates under mono-frequency conditions. This implies a certain selectivity, because the frequency of the injected modulated beam must be located in a relatively narrow range surrounding the single frequency Fo of the photoreceiver laser. This selectivity can have advantages in certain cases (e.g. for frequency multiplexing), but often leads to disadvantages in normal transmission, because it makes it necessary to tune the frequency of the receiver 10 to that of the emitter 30 or vice versa.

DESCRIPTION OF THE INVENTION

The present invention aims at obviating said disadvantage. To this end, it proposes a much less frequency selective photoreceiver, which greatly simplifies its realization by eliminating the matching of the reception range to the emission range or vice versa.

To obtain this result, the photoreceiver according to the invention uses a laser operating under longitudinal multimode conditions. It is known that such conditions are obtained by using a FABRY-PEROT resonator constituted by two reflecting faces frequently obtained by the cleaving and regulating of the length of said resonator so that the interval between two longitudinal modes (interval equal to the quantity c/2nL, in which c is the speed of light, n the index of the medium and L the length of the FABRY-PEROT resonator) exceeds the width of the emission line. The photoreceiver can then function around any one of the longitudinal modes of the laser in overlapping frequency ranges, which leads to a wide overall band, where operation is possible. Therefore the frequency selectivity has disappeared. Thus, a laser having a 4 mm long resonator no longer has a frequency selectivity for a signal of excursion 9 GHz.

The present invention also relates to an optical link, which is either unidirectional using a photoreceiver like that defined hereinbefore, or bidirectional using two subassemblies comprising photoreceiver means according to the invention, each being able to operate in emission or reception, namely either in alternating or permanent manner.

DETAILED DESCRIPTION OF THE EMBODIMENTS

Figure 1:
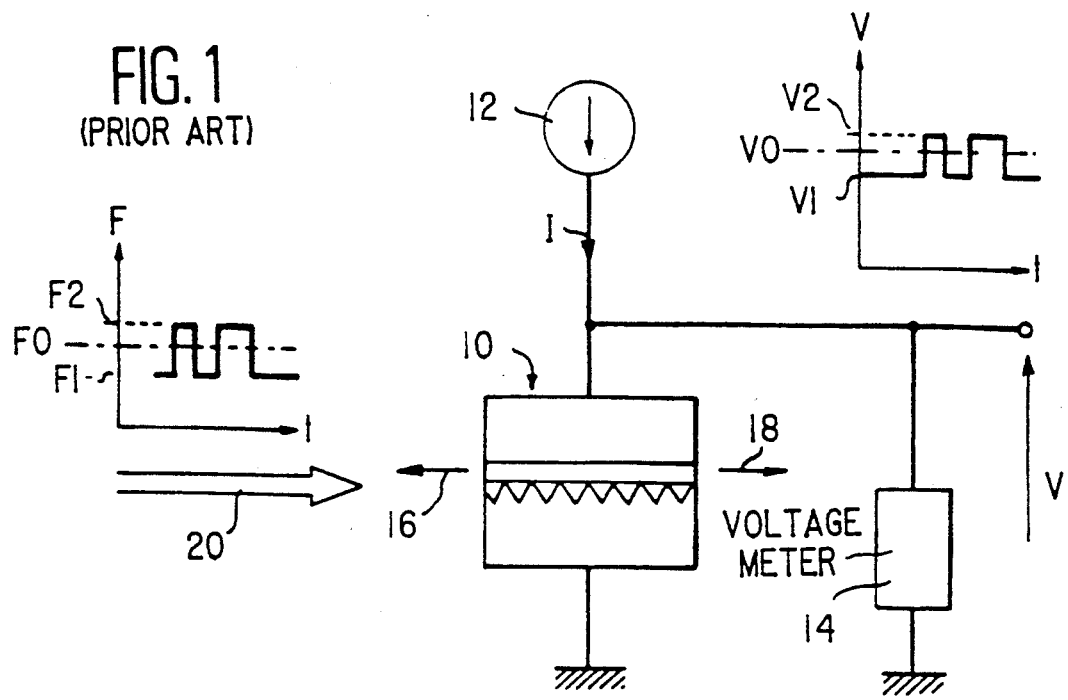
FIG. 1 shows a prior art selective photoreceiver.
Figure 2:
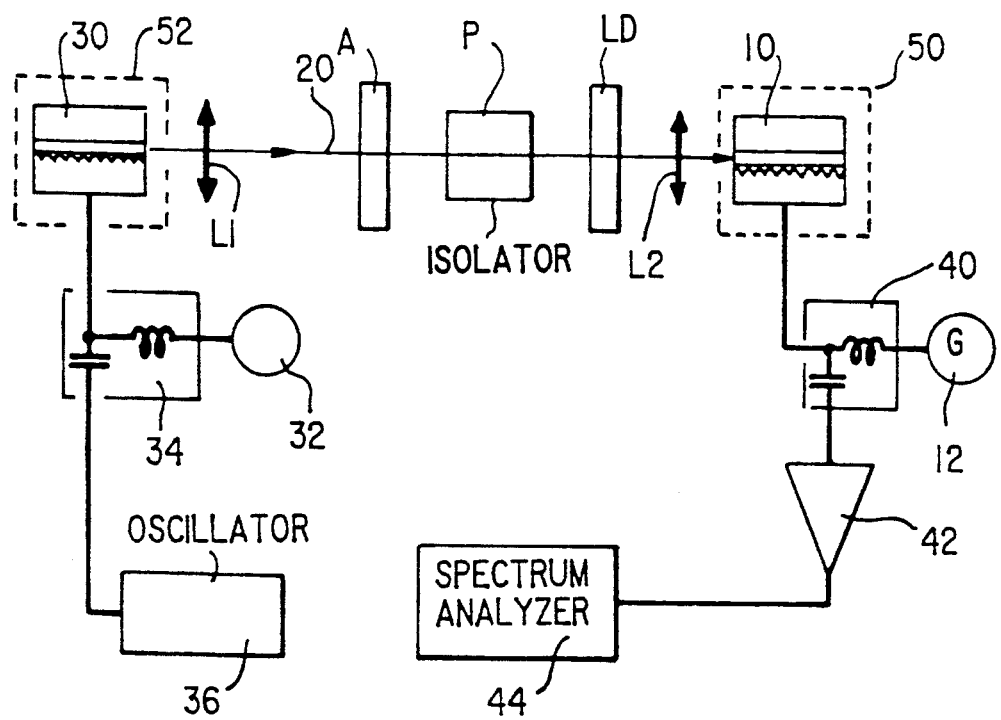
FIG. 2 shows an optical link according to the prior art.
Figure 3:
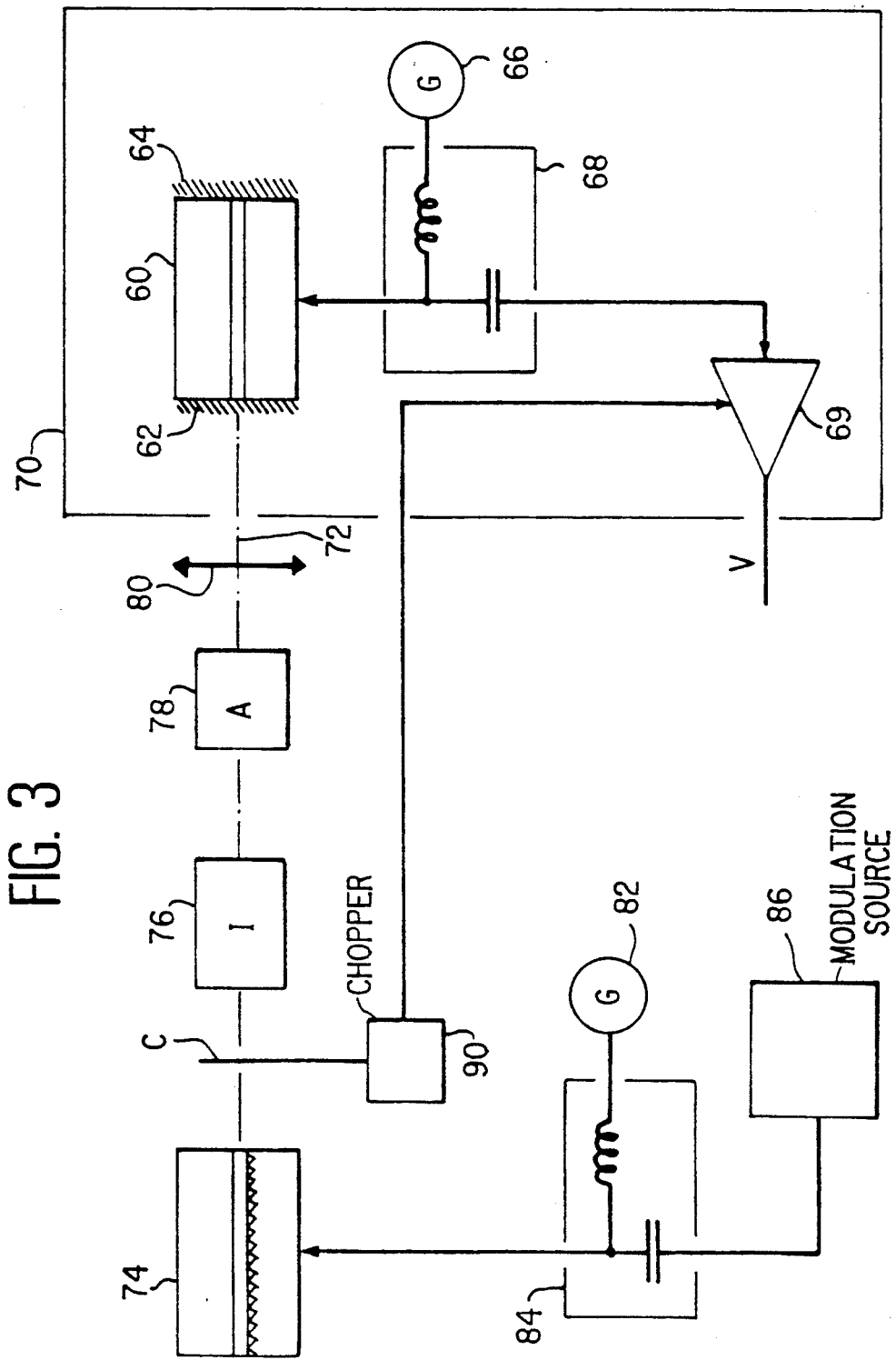
FIG. 3 shows an experimental arrangement for studying the non-selective photoreceiver according to the invention.

FIG. 3 shows a FABRY-PEROT-type semiconductor laser 60, i.e. constituted by two facing reflecting faces 62, 64. In FIG. 3 said two faces are assumed to be the cleaved faces of the semiconductor structure, but this arrangement in no way limits the invention. Independent mirrors can be used. This laser 60 is supplied by a power supply 66 supplying the laser well above the threshold (e.g. 2 to 3 times the threshold current). The supply 66 is connected to the laser 60 by a T-circuit 68 comprising an inductance coil and a capacitor. This circuit is also connected to an amplifier 69 supplying a voltage V.

This first subassembly 70 constitutes the photoreceiver according to the invention. This photoreceiver receives a light beam 72 from a frequency-modulated light source and which, in the illustrated embodiment, is constituted by a laser 74, e.g. of the distributed feedback (DFB) type. The light beam traverses various optical elements such as an isolator 76, an attenuator 78 and a lens 80.

The emitter laser 74 is supplied by a supply 82 across a T-circuit 84 having an inductance coil and a capacitor. A modulation source 86 makes it possible to weakly modulate the supply current and therefore modulate the emission frequency. An all or nothing beam modulating device or chopper 90 can be provided, with a synchronous amplification at the amplifier 69.

Figure 4:
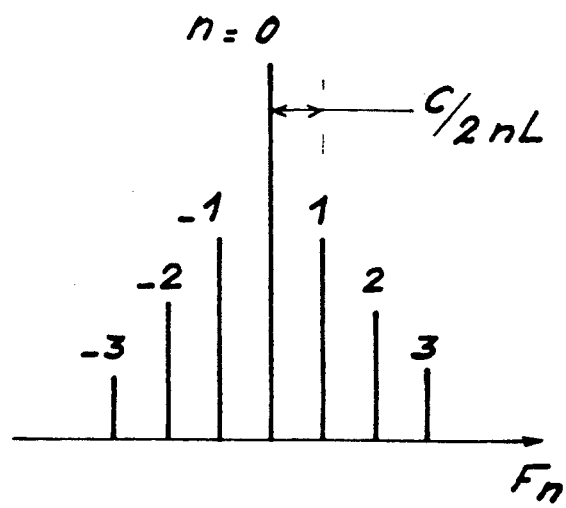
FIG. 4 shows the operating spectrum of a multimode laser.

FIG. 4 shows the various longitudinal modes on which oscillate the photoreceiver laser 60. These modes can be designated by an index n, which can be of value 0 in the centre of the emission line and have values $(+1, -1)/(+2, -2)/(+3, -3)$ etc. . . . on either side of the centre of the line. The frequency of these modes is designated $F_n$. The frequency swing between two consecutive modes is equal to $c/2nL$ and is inversely proportional to the FABRY-PEROT resonator length L.

Figure 5:
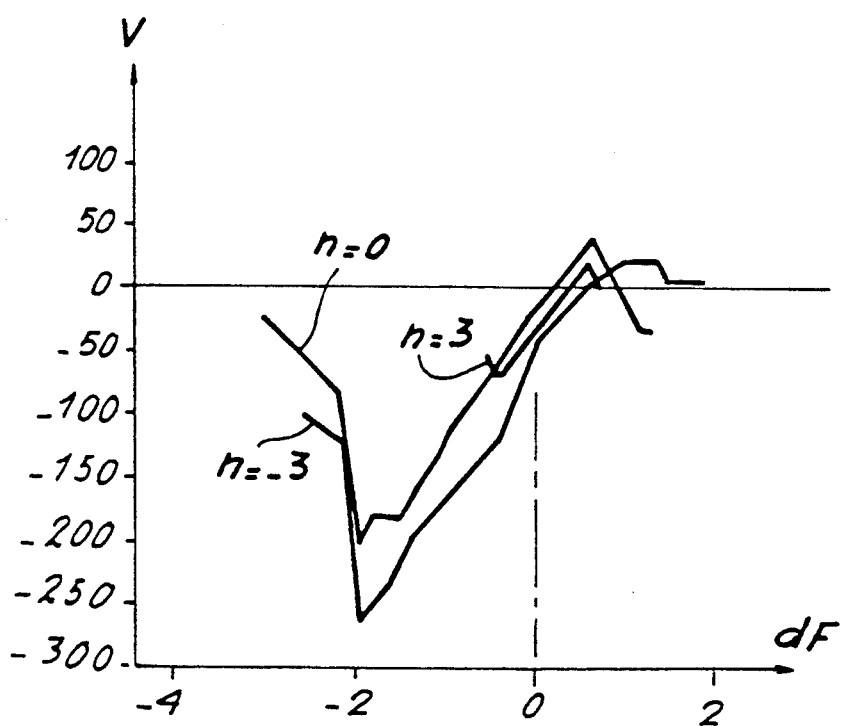
FIG. 5 shows the voltage variations at the laser terminals as a function of the frequency swing of the optical signal with respect to the frequencies of the various laser modes.

FIG. 5 shows the variations of the voltage V taken at the terminals of the laser 60 and amplified by the amplifier 69. On the abscissa can be seen the frequency swing dF in GHz between the frequency F of the laser beam injected into the laser and the frequency $F_n$ of one of the longitudinal modes and, on the ordinate, the voltage V in microvolts, supplied by the amplifier 69. FIG. 5 shows the curve applicable to the mode $n=0$ and those applicable to the extreme modes $n=\pm 3$. Each of these curves have the characteristic shape of a monomode photoreceiver, such as that described in the two aforementioned documents. However, as a result of the multimode character, it can be seen that the photoreceiver according to the invention is able to respond to a frequency-modulated optical signal when the frequency of said signal drops into a wide range starting before the mode $n=-3$ and finishing after the mode $n=3$.

The photoreceiver described hereinbefore can be used in various optical links. Its symmetrical character (it constitutes not only a receiver, but also an emitter) and its absence of selectivity make it particularly suitable for forming the subassemblies present at each end of an optical line, each subassebly being able to operate in emission and/or reception.

Figure 6:
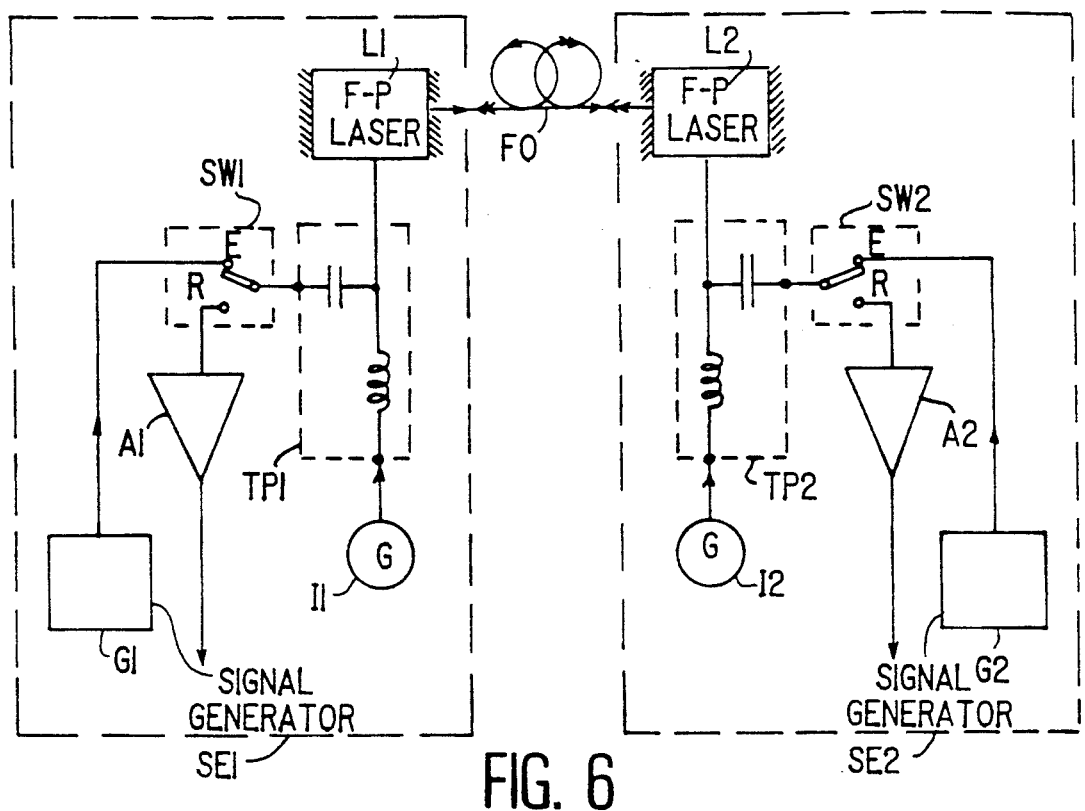
FIG. 6 illustrates a biderectional optical link operating in alternating manner.

The link shown in FIG. 6 thus comprises a first subassembly SE1 and a second subassembly SE2, both of which are identical and interconnected by one or more optical fibres Fo. The means constituting these subassemblies are designated by letters allocated with an index 1 or 2 as a function of whether it is the first or second subassembly. Thus, in the subassembly SE1, there is a FABRY-PEROT resonator laser L1, a power supply I1, a polarization T-coupler TP1, a signal generator G1, an amplifier A1 and a switch SW1 with a terminal E making it possible to connect the generator G1 to the laser for operation in emission and a terminal R connecting the laser to the amplifier A1 for operation in reception.

The subassembly SE2 comprises the same means. However, the switches SW1 and SW2 are controlled in opposition. If SW1 is on position E, SW2 is on position R and vice versa. Thus the link sometimes operates in one direction (SE1 being an emitter subassembly and SE2 a receiver subassembly) and sometimes in the other (SE2 emitter, SE1 receiver). Thus, the link operates in alternating manner.

Figure 7:
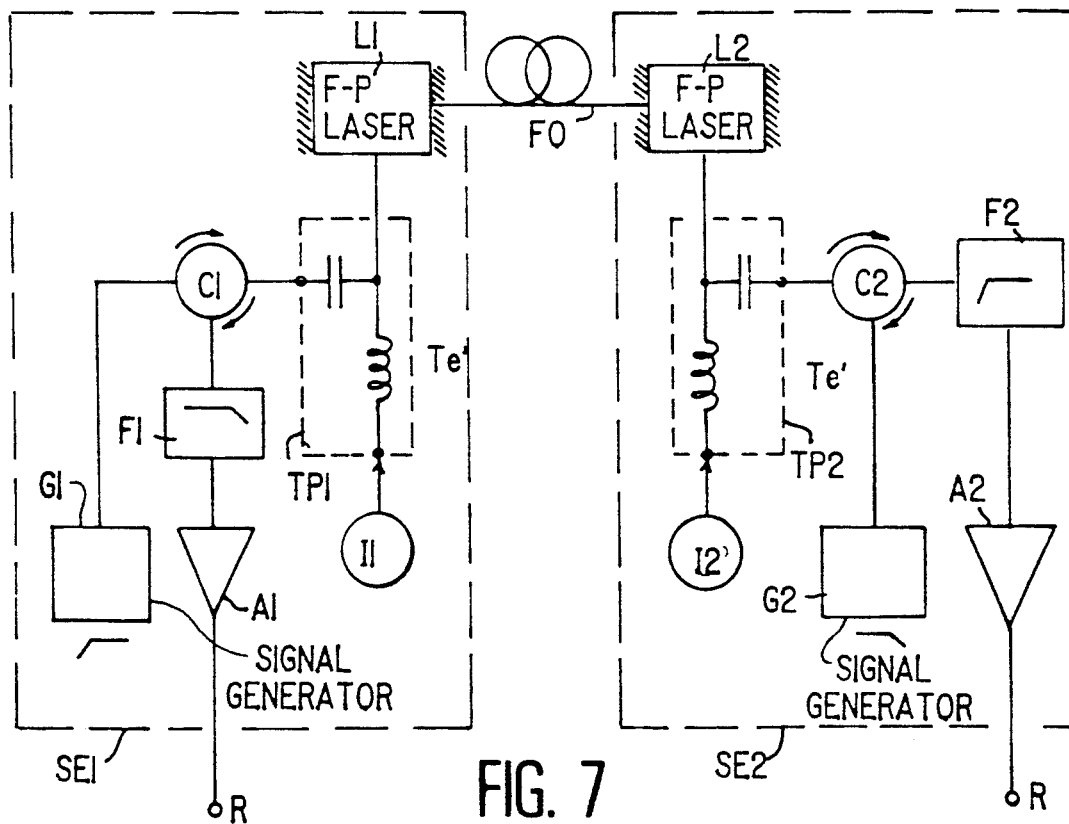
FIG. 7 illustrates a bidirectional optical link operating simultaneously in both directions.

The same means are provided in the variant illustrated in FIG. 7, but in this subassembly there are also high pass and low pass-type filtering means. More specifically, in the subassembly SE1 the generator G1 operates on a high frequency range and comprises a low pass-type filter F1 positioned between a circulator C1 and the amplifier A1. In similar manner, the subassembly SE2 comprises a generator G2 operating in a low range (corresponding to the band of the low pass filter F1) and a high pass filter F2 located between a circulator C2 and an amplifier A2.

Figure 8:
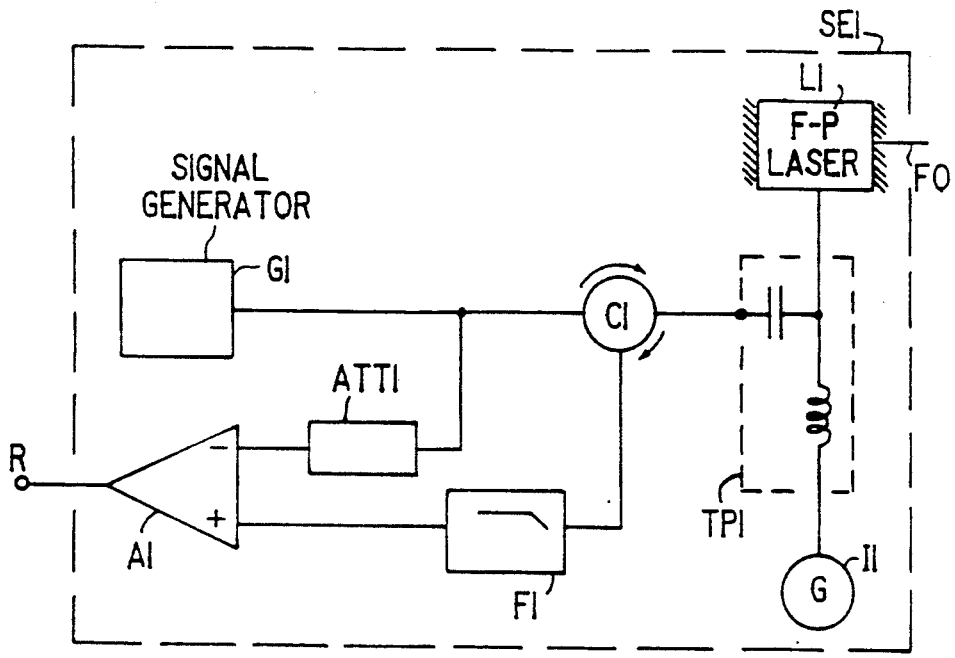
FIG. 8 illustrates an embodiment of a subassembly.

In the variant illustrated in FIG. 8, each subassembly (only subassembly SE1 being shown) comprises an attenuator ATT1 inserted between the generator G1 and the inverted input (−) of the amplifier A1, which is then of the differential amplifier type, the forward input (+) receiving the signal filtered by F1. In this variant it is possible to minimize interference between the two transmission channels by subtraction of the signals in phase.

No matter what the ratio between the width of the high band and the width of the low band, the high band can transmit more information than the low band. This asymmetry can be obviated by using, for the high band, the subcarrier multiplexing (SCM procedure). This also permits the use of frequency multiplexing of a carrier in the manner illustrated in FIG. 9.

Figure 9:
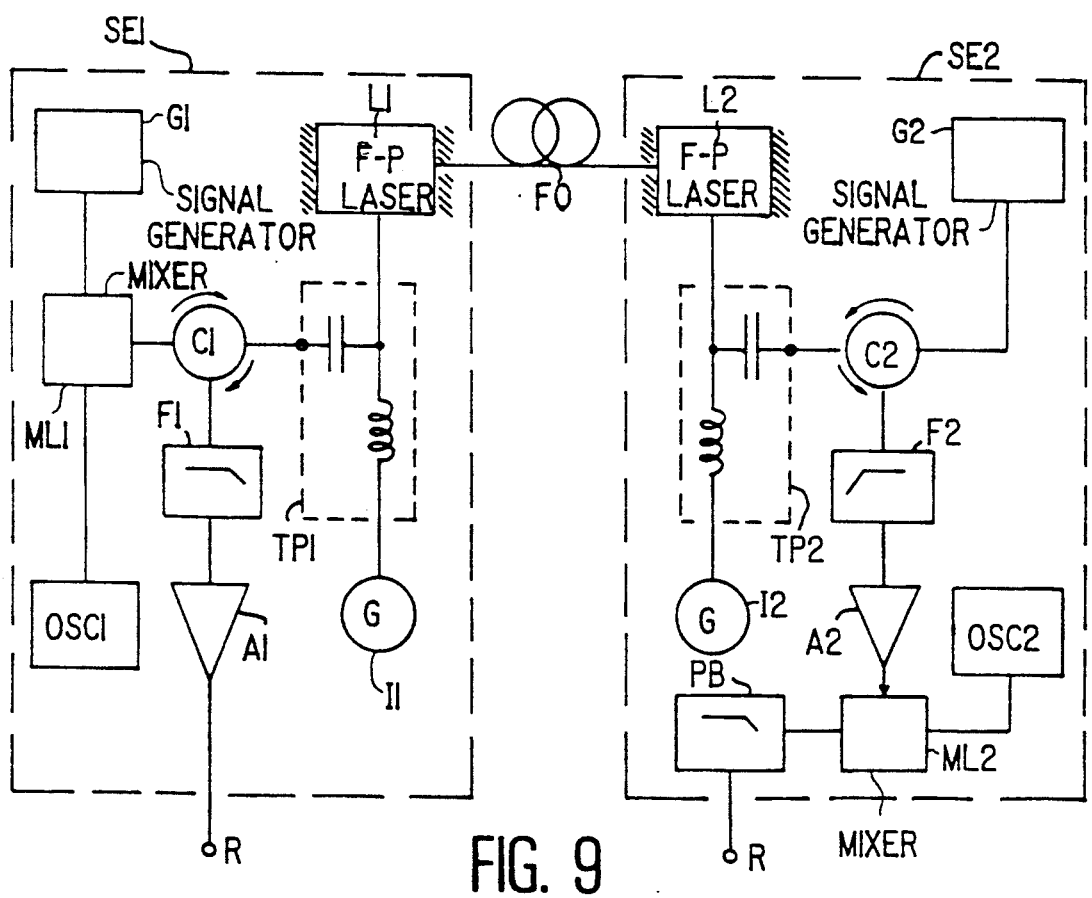
FIG. 9 illustrates another embodiment of a bidirectional link.

FIG. 9 illustrates an embodiment of a 250 Mb/s link. This link comprises, apart from the means already described, two oscillators OSC 1 and OSC 2 supplying a carrier at 500 MHz and two mixers ML 1 and ML 2. The signal from the generator G1 is mixed with the 500 MHz carrier in the mixer ML 1 and the result is supplied to the laser L1 for modulation. The electric signal taken at the terminals of L1 is filtered in F1 and amplified by A1.

In the subassembly SE2, the signal detected by L2 is firstly filtered by F2 and then amplified by A2 and the 500 MHz carrier from OSC 2 is subtracted in ML 2 in the thus filtered and amplified signal. The modulation of the laser L2 takes place directly by the signal from the generator G2.

Figure 10:
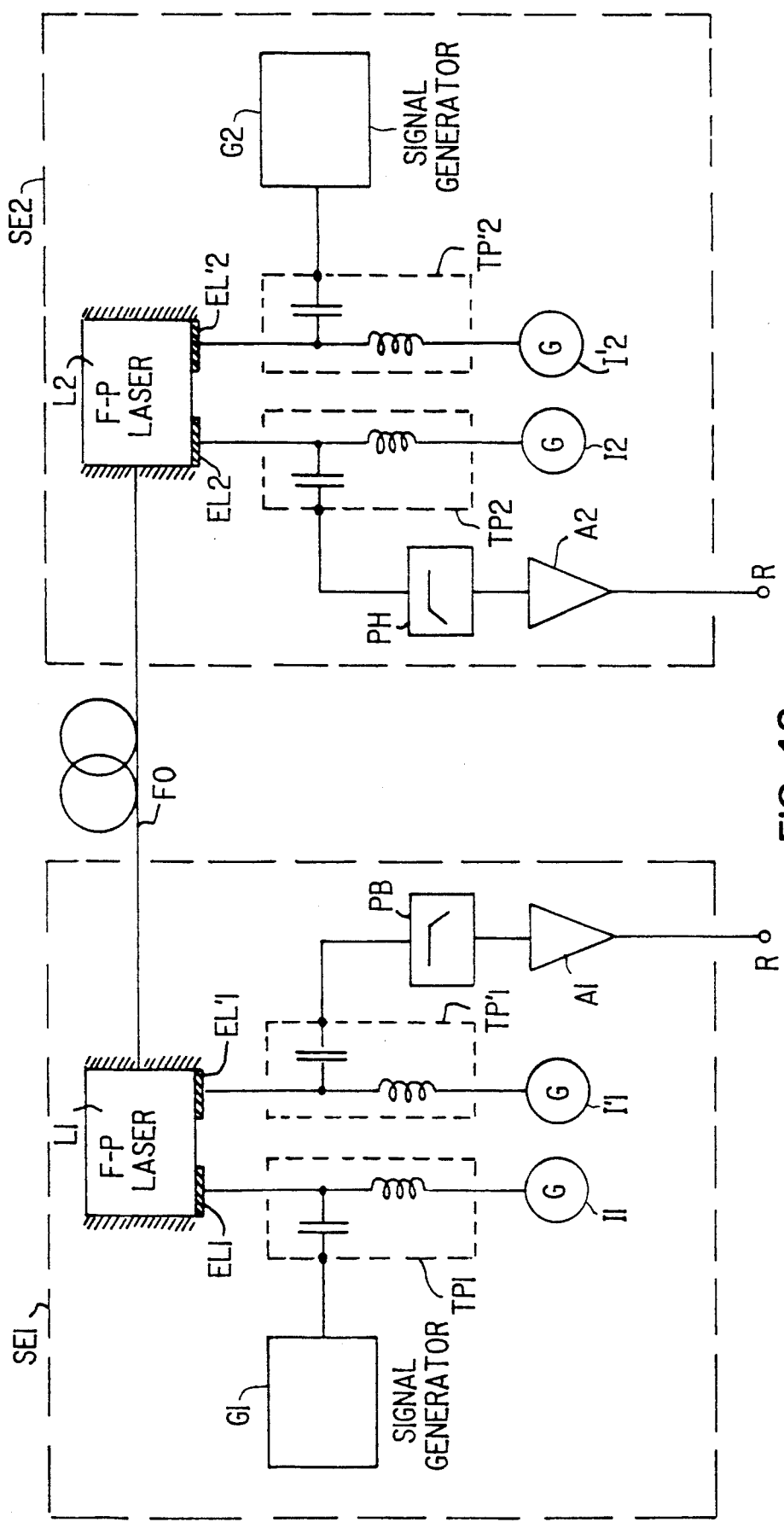
FIG. 10 shows a bidirectional link using lasers having two electrodes.

In the preceding description, the lasers used implicitly have a single electrode connected to the polarization T-coupler. However, it would not pass outside the scope of the invention to use multielectrode lasers, which are themselves known means. FIG. 10 e.g. shows a link using lasers having two electrodes, respectively (EL 1, EL'1) for the laser L1 and (EL 2, EL'2) for the laser L2. These electrodes are connected to two polarization T-couplers (TP1, TP'1) for the laser L1 and (TP2, TP'2) for the laser L2, said couplers being connected to two power supplies (I1, I'1) and (I2, I'2).

I claim:

1. A photoreceiver for frequency-modulated optical signals, comprising:
   a semiconductor laser with an active layer and terminals;
   a polarization current supply for supplying the laser with current at a value above a threshold current, the laser functioning as an oscillator;
   optical means for injecting a frequency modulated light beam in the active layer of the laser; and
   means for sampling a voltage present at the laser terminals,
   said photoreceiver being characterized in that the laser comprises a FABRY-PEROT-type resonator and oscillates on several longitudinal modes of different frequencies.

2. A monodirectional optical link comprising:
   an emitter having a semiconductor laser;
   means for supplying current to said laser;
   means for frequency modulating a light beam emitted by the laser; and
   a photoreceiver able to receive the light beam emitted by the laser and supply a voltage representing frequency modulation of the light beam emitted by the laser and received by the photoreceiver,
   said link being characterized in that the photoreceiver comprises the photoreceiver of claim 1.

3. A bidirectional optical link comprising:
   first and second identical subassemblies each having a semiconductor laser, the first and second subassemblies being able to operate both as a photoemitter and as a photoreceiver; and
   first and second frequency modulation means respectively connected to said first and second subassemblies for operating said first and second subassemblies as photoemitters,
   characterized in that the first and second subassemblies are constituted by the photoreceiver of claim 1.

4. A bidirectional optical link according to claim 3, characterized in that each subassembly comprises:
   a switch for making it possible to connect the semiconductor laser either to a generator of a signal to be transmitted for emission operation of the laser, or to an amplifier for a laser reception operation, said two switches being controlled in synchronism and opposition, so that the link operates in alternating directions.

5. A bidirectional optical link according to claim 3, characterized in that the first and second frequency modulation means of the first and second subassemblies respectively operate in a high and a low frequency band, the first subassembly having a low pass filter inserted in the means for sampling the voltage at terminals of the first laser and the second subassembly having a high pass filter inserted in the means for sampling the voltage at terminals of the second laser, so that the link operates in two directions.

6. Optical link according to any one of the claims 2 to 5, characterized in that the laser of each subassembly is of the multielectrode type.

* * * * *